United States Patent
Akiyama et al.

(10) Patent No.: US 11,800,805 B2
(45) Date of Patent: Oct. 24, 2023

(54) COMPOSITE SUBSTRATE, SURFACE ACOUSTIC WAVE DEVICE, AND METHOD FOR MANUFACTURING COMPOSITE SUBSTRATE

(71) Applicant: SHIN-ETSU CHEMICAL CO., LTD., Tokyo (JP)

(72) Inventors: Shoji Akiyama, Gunma (JP); Masayuki Tanno, Gunma (JP)

(73) Assignee: SHIN-ETSU CHEMICAL CO., LTD., Tokyo (JP)

(*) Notice: Subject to any disclaimer, the term of this patent is extended or adjusted under 35 U.S.C. 154(b) by 1204 days.

(21) Appl. No.: 16/348,344

(22) PCT Filed: Oct. 10, 2017

(86) PCT No.: PCT/JP2017/036707
§ 371 (c)(1),
(2) Date: May 8, 2019

(87) PCT Pub. No.: WO2018/088093
PCT Pub. Date: May 17, 2018

(65) Prior Publication Data
US 2020/0058842 A1     Feb. 20, 2020

(30) Foreign Application Priority Data

Nov. 11, 2016 (JP) ................................. 2016-220238
Apr. 28, 2017 (JP) ................................. 2017-089666

(51) Int. Cl.
*H03H 9/02* (2006.01)
*H10N 30/00* (2023.01)
(Continued)

(52) U.S. Cl.
CPC ........ *H10N 30/10516* (2023.02); *H03H 3/08* (2013.01); *H03H 9/02559* (2013.01);
(Continued)

(58) Field of Classification Search
CPC ............. H10N 30/1051; H10N 30/072; H10N 30/079; H10N 30/086; H03H 9/02559; H03H 9/02834; H03H 9/02897
See application file for complete search history.

(56) References Cited

U.S. PATENT DOCUMENTS

| | | | |
|---|---|---|---|
| 2004/0104981 A1 | 6/2004 | Fujii et al. | |
| 2005/0097716 A1* | 5/2005 | Takakuwa | H10N 30/80 29/25.35 |

(Continued)

FOREIGN PATENT DOCUMENTS

| | | |
|---|---|---|
| CN | 1498428 A | 5/2004 |
| EP | 3 229 260 | 10/2017 |

(Continued)

OTHER PUBLICATIONS

Official Communication issued in European Patent Office (EPO) Patent Application No. 17870478.9, dated May 14, 2020.
(Continued)

*Primary Examiner* — Derek J Rosenau
(74) *Attorney, Agent, or Firm* — GREENBLUM & BERNSTEIN, P.L.C.

(57) ABSTRACT

There are provided a method for manufacturing a substrate excellent in heat dissipation with a small loss in radio frequencies with no need of a high temperature process in which a metal impurity is diffused, and a substrate of high thermal conductivity. A composite substrate according to the present invention is a composite substrate having a piezoelectric single crystal substrate, a support substrate, and an intermediate layer provided between the piezoelectric single crystal substrate and the support substrate. The intermediate layer is a film formed of an inorganic material, and at least a part of the film is thermally synthesized silica. The intermediate layer may be separated into at least two layers along the bonding surface of the composite substrate. The
(Continued)

first intermediate layer in contact with the support substrate may be a layer including thermally synthesized silica.

15 Claims, 9 Drawing Sheets

(51) Int. Cl.
*H03H 3/08* (2006.01)
*H03H 9/25* (2006.01)
*H10N 30/072* (2023.01)
*H10N 30/079* (2023.01)
*H10N 30/086* (2023.01)

(52) U.S. Cl.
CPC .... *H03H 9/02834* (2013.01); *H03H 9/02897* (2013.01); *H03H 9/25* (2013.01); *H10N 30/072* (2023.02); *H10N 30/079* (2023.02); *H10N 30/086* (2023.02)

(56) References Cited

U.S. PATENT DOCUMENTS

| | | | |
|---|---|---|---|
| 2012/0242755 A1* | 9/2012 | Nawano | B41J 2/1642 29/25.35 |
| 2014/0267508 A1* | 9/2014 | Ohashi | B41J 2/1645 310/330 |
| 2017/0250674 A1 | 8/2017 | Takamine et al. | |
| 2018/0048282 A1* | 2/2018 | Kurimoto | H03H 9/02574 |

FOREIGN PATENT DOCUMENTS

| | | |
|---|---|---|
| EP | 3490144 A1 | 5/2019 |
| EP | 3490146 A1 | 5/2019 |
| EP | 3525347 A1 | 8/2019 |
| JP | 2001-53579 | 2/2001 |
| JP | 2005-229455 A | 8/2005 |
| JP | 2006-303940 | 11/2006 |
| JP | 2007-169123 | 7/2007 |
| JP | 2010-161359 | 7/2010 |
| JP | 2015-23474 | 2/2015 |
| JP | 2015-119219 | 6/2015 |
| JP | 2016-72808 | 5/2016 |
| WO | 2004/006431 A1 | 1/2004 |
| WO | 2014/087877 | 6/2014 |
| WO | 2016/088466 | 6/2016 |
| WO | 2016/103953 | 6/2016 |

OTHER PUBLICATIONS

Office Action issued in European Patent Office (EPO) Counterpart Patent Appl. No. 17870478.9, dated Feb. 24, 2021.
Journal of the Electrochemical Society, vol. 122, No. 3, pp. 413-418 "Oxide Growth on Etched Silicon in Air at Room Temperature," dated Mar. 1975.
Journal of Applied Physics, vol. 68, No. 3, pp. 1272-1281 "Growth of native oxide on a silicon surface," dated Aug. 1, 1990.
Office Action issued in TW Patent Application No. 106137845, May 19, 2022, translation.
"Temperature compensation technology for SAW-Duplexer used in RF front end of smartphone", Dempa Shimbun High Technology, Nov. 8, 2012.
"A study on Temperature-Compensated Hybrid Substrates for Surface Acoustic Wave Filters", 2010 IEEE International Ultrasonic Symposium (IUS2010), 2010, pp. 637-640.
International Search Report issued in International Patent Application No. PCT/JP2017/036707, dated Jan. 9, 2018.
Written Opinion of the International Searching Authority for International Patent Application No. PCT/JP2017/036707, dated Jan. 9, 2018.

* cited by examiner (a)

(b)

(c)

COMPOSITE SUBSTRATE, SURFACE ACOUSTIC WAVE DEVICE, AND METHOD FOR MANUFACTURING COMPOSITE SUBSTRATE

TECHNICAL FIELD

The present invention relates to a composite substrate, a surface acoustic wave device, and a method for manufacturing a composite substrate.

BACKGROUND ART

Nowadays, in the market of mobile communications represented by smartphones, communication volumes are rapidly increasing. In the course of increasing the number of bands necessary to cope with this problem, a reduction in size of various components and an increase in the performance of components are inevitably necessary. Lithium tantalate (sometimes abbreviated to LT) and lithium niobate (sometimes abbreviated to LN) that are typical piezoelectric materials are widely used as the materials of surface acoustic wave (SAW) devices. However, these materials have a large electro-mechanical coupling coefficient, and can provide a wide range of wavelengths. On the other hand, the materials have a problem that temperature stability is low and this causes a shift in frequencies at which device can operate. This results from lithium tantalate or lithium niobate having an extremely high expansion coefficient.

In order to mitigate this problem, a method is proposed in which a material having a small expansion coefficient, such as sapphire and silicon (Si), is bonded to a piezoelectric single crystal, such as lithium tantalate (LT) and lithium niobate (LN), and the thickness of the piezoelectric single crystal is reduced to a few μm to a few tens μm by grinding, for example. FIG. 1 is a graph of thermal expansion coefficients of various materials in comparison. The thermal expansion of the piezoelectric single crystal is reduced by bonding the material having a small expansion coefficient, and hence the temperature characteristics are improved (e.g. see Non Patent Document 1).

However, in this method, there is a problem that a stack of a thin piezoelectric single crystal film on a support substrate causes noise referred to as spuriousness or ripples in an antiresonance frequency band. The noise is caused due to reflection from the interface between the piezoelectric single crystal film and the support substrate. As an example, FIG. 2 shows an exemplary spectrum at the reflection coefficient (S11) of a resonator prepared using a composite substrate having a stack of an LT film in 20 μm thickness on a silicon substrate. In FIG. 2, the difference between the peak and bottom of the spectrum is defined as spurious intensity (amplitude).

Some methods are proposed for solving this problem. For example, Non Patent Document 2 discloses a method in which the bonding surface of LT is roughened with a #1000 grinding wheel to obtain a roughness of 300 nm in the arithmetic average roughness (Ra) and then the LT is bonded to a support substrate through an adhesive. However, in this method, the Lt is bonded to the substrate using an organic adhesive, resulting in a problem of the viewpoint of reliability. Specifically, after bonding, a plurality of processes is scheduled in which the substrate surface is patterned, the substrate is diced, and chips are mounted on devices. However, in the processes, heating processes at temperatures of 250 to 400° C. are repeated. As a result, organic substances made up of the adhesive are altered, resulting in a problem that a piezoelectric crystal film on the bonded substrate is peeled or cracked.

Therefore, there is a method in which an intermediate layer made of an inorganic material is formed on a piezoelectric single crystal substrate formed with an irregular structure and a support substrate is joined such that this intermediate layer is sandwiched. Examples of inorganic materials that are used as an intermediate layer include $SiO_x$ (1.5≤x≤2.5), $Al_2O_3$, AlN, SiN, SiON, and $Ta_2O_5$, for example. Representative examples of methods for forming this intermediate layer include chemical vapor deposition (CVD) and physical vapor deposition (PVD) represented by sputtering, for example. Alternatively, a method can also be adopted in which a solution of an organic silicon compound is applied on a wafer and the solution is hardened by heat treatment to form an $SiO_2$ film. After the inorganic material film is deposited by these methods, heat treatment is performed at a high temperature to some extent to eliminate a gas (an out gas) generated from the inside of the film. This is because without performing this process, there is a possibility that gas components generated in a deposited film near the bonding interface in repeating heat treatment in the post-processes of bonding reach the bonding interface to cause a peeling phenomenon from the bonding interface.

However, piezoelectric single crystals, such as LT and LN, have the upper limit temperature referred to as a Curie temperature at which polarization is destroyed, and can not be heated to higher temperature to maintain the polarization state. In particular, LT has its Curie temperature near 600° C. It is extremely difficult to fully eliminate out gases even if processing is carried out below this temperature, and it is difficult to attain long-term reliability.

Another reason why high temperature heat treatment is not applicable is that $SiO_2$ that is an inorganic material used for an intermediate layer and a piezoelectric crystal, such as LT and LN, have a great difference in their thermal expansion coefficients. The thermal expansion coefficient of LT and LN is about 16 ppm, and the thermal expansion coefficient of $SiO_2$ is about 0.5 ppm. This difference causes cracks after high temperature treatment, and the subsequent processes can not be performed.

In the findings by the inventors, after $SiO_2$, $Al_2O_3$, AlN, $Si_3N_4$, SiON, and $Ta_2O_5$ are deposited as intermediate layers each in a thickness of about 2 μm on an LT single crystal substrate for heat treatment, cracks are generated at a temperature of about 500 to 600° C. not greatly depending on the materials the intermediate layers or deposition methods. As an example, FIG. 3 shows results of out gas analysis on samples in which an inorganic layer simulating an intermediate layer were prepared by three different methods. The first one is an analysis result of thermal desorption spectrometry (TDS) in which $SiO_2$ was deposited in a thickness of 5 μm on an LT single crystal substrate by CVD and then heat treatment was applied from at ambient temperature to a temperature of 1,000° C. From this result, the peak of the out gas is at near a temperature of 500° C. However, after that, it is shown that gases are continuously generated until the temperature reaches a temperature of 1,000° C. The second one is a TDS analysis result in which $SiO_2$ was deposited in a thickness of 5 μm by spin coating methyltrimethoxysilane (a solvent was propylene glycol monoethyl ether) and then similar heat treatment was applied. Also in this case, the peak of the out gas is at near a temperature of 500° C., degassing is continued even at a temperature of 600° C. or more, and gases are continuously generated even at a temperature of 1,000° C. The third one is a TDS analysis result in which $SiO_2$ was deposited in a thickness of 5 µm by PVD and then similar heat treatment was applied. Also in this case, the peak of the out gas is at near a temperature of 500° C. and degassing is continued even at a temperature of 600° C. or more and continued until the temperature reaches a temperature of 1,000° C. As described above, it is shown that the intermediate layers deposited by these methods have to be subjected to heat treatment at a temperature of 1,000° C. or more for degassing.

PRIOR ART REFERENCES

Patent Document

Non Patent Document 1: "Temperature compensation technology for SAW-Duplexer used in RF front end of smartphone", Dempa Shimbun High Technology, Nov. 8, 2012

Non Patent Document 2: "A study on Temperature-Compensated Hybrid Substrates for Surface Acoustic Wave Filters", 2010 IEEE International Ultrasonic Symposium (IUS2010), Vol. V1, pp. 637-640, 2010

SUMMARY OF THE INVENTION

Problems to be Solved by the Invention

The present invention has been made in view of the above circumstances. An object is to provide a composite substrate having a piezoelectric single crystal layer bonded to a support substrate using an inorganic material as an intermediate layer in which peeling hardly occurs even though heating and cooling are repeated in processes after bonding.

Means for Solving the Problems (1) A composite substrate according to the present invention has a piezoelectric single crystal substrate, a support substrate, and an intermediate layer provided between the piezoelectric single crystal substrate and the support substrate. The intermediate layer is a film formed of an inorganic material, and at least a part of the film is thermally synthesized silica.

As result of investigation dedicatedly made by the present inventors, the present inventors found that thermally oxidized silica or thermally synthesized silica, such as a synthetic silica sintered body, has the properties that can absorb gasses to some extent. At least a part of the intermediate layer is thermally synthesized silica like the above configuration, and thermally synthesized silica absorbs an out gas possibly generated in heating and cooling in the post-processes even though the rest of the intermediate layer is an inorganic material that insufficiently degases the out gas. Thus, peeling can hardly occur.

(2) In the present invention, the intermediate layer may be separated into at least two layers along a bonding surface of the composite substrate. In this case, a first intermediate layer in contact with the support substrate may be a layer including the thermally synthesized silica.

Since there are a few constraints on a heating temperature, such as the Curie temperature, on the support substrate side, the layer of the intermediate layer in contact with the support substrate can be formed by deposition of thermally synthesized silica. On the other hand, the intermediate layer on the piezoelectric single crystal substrate side is an inorganic material that can be formed by deposition at a low temperature lower as a Curie temperature or less. In repeating heating and cooling in the post-processes, thermally synthesized silica on the support substrate side absorbs an out gas possibly emitted from the intermediate layer on the piezoelectric substrate side, and hence peeling hardly occurs.

(3) In the present invention, a material of the support substrate may be a silicon substrate. In this case, the thermally synthesized silica may be synthesized by thermal oxidation of the silicon substrate. With this configuration, the thermal oxidation layer is formed on the surface of the silicon substrate, and can be used as a part of the intermediate layer. Thermally synthesized silica can be easily formed.

(4) Alternatively, thermally synthesized silica may be a sintered body of synthetic silica. With this configuration, not only silicon but also a heat resistant substrate such as sapphire, silicon nitride, aluminum nitride, silicon carbide or quartz glass can be used as the material of the support substrate. Silica that is deposited on the support substrate by a given method is heated together with the support substrate, sintered silica is formed on the surface of the support substrate, and the sintered silica can be used as a part of the intermediate layer. A deposition method of silica may be chemical vapor deposition (CVD), physical vapor deposition (PVD), and applying and baking of a solution of an organic silicon compound, for example. For example, in the case of silica prepared by PVD, since the film property immediately after deposition is not dense, sintering may be performed by heat treatment at a temperature of around 1,000° C.

(5) In the present invention, a material of a second intermediate layer provided on the piezoelectric single crystal substrate side of a first intermediate layer in contact with the support substrate may include at least one of $SiOx$, $Al_2O_3$, $AlN$, $SiN$, $SiON$, and $Ta_2O_5$. The above-mentioned substances are preferable because the substances can be deposited and processed by CVD and PVD, for example, at a temperature of 500° C. or less that is relatively low temperature.

(6) In the present invention, the second intermediate layer may have at least two layers having different materials. The at least two layers may be layers of materials having different thermal expansion coefficients. With this configuration, a plurality of layers of different materials can relax thermal stress, and cracks or peeling can hardly occur.

(7) In the present invention, a thickness of the first intermediate layer may be 20 nm or more. With this configuration, the first intermediate layer can be provided with a sufficient out gas absorption capability.

(8) In the present invention, a thickness of the second intermediate layer may be 25 µm or less. With this configuration, cracks can be prevented from being generated in the piezoelectric single crystal substrate caused by stress due to the difference in the thermal expansion coefficient between the piezoelectric single crystal substrate and the second intermediate layer. Note that there is no constraint specifically on the lower limit of the thickness of the second intermediate layer. In the case in which the interface to the piezoelectric single crystal substrate is flat, the thickness may be 50 nm or more. In the case in which the interface has an irregular structure, the projections of the piezoelectric single crystal substrate may be accommodated in the second intermediate layer.

(9) In the present invention, a thermally synthesized silica layer may be further provided on a back surface of the support substrate (i.e., the surface on the opposite side of the surface joined to the piezoelectric single crystal as the intermediate layer is sandwiched). With this configuration, the thermally synthesized silica layer is formed on both sides of the support substrate, the stress applied to the support substrate achieves a balance, and the warpage of the substrate is mitigated.

(10) In the present invention, the first intermediate layer may be joined to the second intermediate layer as a third intermediate layer formed of amorphous silicon is sandwiched between the first intermediate layer and the second intermediate layer. With this configuration, the joining strength can be improved, and cracks or peeling can hardly occur. The thickness of the third intermediate layer may be 50 nm or less. With this configuration, an out gas generated on the second intermediate layer side can be excellently transmitted on the first intermediate layer side.

(11) In the present invention, a thickness of the intermediate layer may be 8 μm or less. With this configuration, the heat resistance of the composite substrate can be improved. (12) More preferably, the thickness of the intermediate layer may be 7 μm or less. With this configuration, the heat resistance of the composite substrate can be further improved.

(13) In the present invention, a thickness of the piezoelectric single crystal may be 20 μm or less. With this configuration, with this configuration, the heat resistance of the composite substrate can be improved.

(14) In the present invention, an interface between the piezoelectric single crystal and the intermediate layer may have an irregular structure. With this configuration, the spurious phenomenon of the resonator prepared from the composite substrate can be suppressed.

(15) A surface acoustic wave device according to the present invention may be configured including any one of the composite substrates. With this configuration, a small-sized surface acoustic wave device of high performance can be implemented.

(16) In the present invention, a thickness of the piezoelectric single crystal may be 1.0 times or more and 3.5 times or less of a wavelength a surface acoustic wave. With this configuration, the Q-value of a resonator prepared using the composite substrate can be improved.

(17) A method for manufacturing a composite substrate according to the present invention includes the steps of: forming a first intermediate layer including thermally synthesized silica on a surface of a support substrate; forming a second intermediate layer including an inorganic material on a surface of a piezoelectric single crystal substrate; flattening a surface of the second intermediate layer; and bonding a surface of the first intermediate layer to the flattened surface of the second intermediate layer.

The first intermediate layer that is a part of the intermediate layer includes thermally synthesized silica by the manufacturing method, the first intermediate layer can absorb an out gas possibly generated from the second intermediate layer in heating and cooling in the post-processes. Thus, peeling can hardly occur in the bonded substrates.

(18) In the present invention, the step of flattening the surface of the first intermediate layer may be further included. With this configuration, even in the case in which the surface of the first intermediate layer obtained by forming thermally synthesized silica is not flat, firm bonding can be implemented. Note that the step of flattening the surface of the first intermediate layer is performed prior to the step of bonding.

(19) In the present invention, the step of forming irregularities on the surface of the piezoelectric single crystal substrate may be further included. With this configuration, the properties of a device prepared from the composite substrate obtained by the manufacturing method can be made excellent. Specifically, for example, the spurious phenomenon of the resonator prepared from the composite substrate obtained by the manufacturing method can be suppressed.

(20) In the present invention, the first intermediate layer may be thermally synthesized silica in which a silica layer deposited by chemical vapor deposition (CVD) is sintered at a temperature of 800° C. or more. (21) The first intermediate layer may be thermally synthesized silica in which a silica layer deposited by physical vapor deposition (PVD) is sintered at a temperature of 800° C. or more. (22) Alternatively, the first intermediate layer may be a layer of thermally synthesized silica in which a solution of an organic silicon compound is applied and sintered at a temperature of 800° C. or more.

In the methods of (20) to (22), the silica layer is sintered at a temperature of 800° C. or more. Thus, the degassing of the silica layer is promoted, and a sintered, fine thermally synthesized silica (sintered silica) film can be formed. The thermally synthesized silica has excellent absorption capability. Note that the temperature in sintering may be preferably a temperature of 1,000° C. or more.

(23) In the present invention, a material of the support substrate may be selected from silicon, sapphire, silicon carbide, silicon nitride, aluminum nitride, and silica glass. With the use of the support substrate having a material of excellent heat resistance, the silica layer can be sintered at a high temperature of 800° C. or more in the methods of (20) to (22). (24) In the case in which the material of the support substrate is silicon, the first intermediate layer may be formed by thermal oxidation of the support substrate. With this configuration, the thermal oxidation layer is formed on the surface of the silicon substrate, and can be used as a part of the intermediate layer. In addition, thermally synthesized silica can be easily formed.

(25) In the present invention, the step of heating the second intermediate layer at a highest temperature lower than a Curie temperature of the piezoelectric single crystal may be further included. When the second intermediate layer is heated at a low temperature as described above, residual gases can be reduced, an out gas generated by repeating heating and cooling in the post-processes can be suppressed, and the occurrence of peeling can be reduced. (26) A temperature when the second intermediate layer is heated may be preferably a temperature of 600° C. or less. With this configuration, cracking of the second intermediate layer due to the difference between the thermal expansions can be suppressed.

(27) In the present invention, in addition to the surface of the support substrate, a thermally synthesized silica layer having a material the same as a material of the first intermediate layer may also be formed on a back surface of the support substrate (i.e., the surface on the opposite side of the surface joined to the piezoelectric single crystal as the intermediate layer is sandwiched). With this configuration, the thermally synthesized silica layer is formed on both sides of the support substrate, stress applied to the support substrate achieves a balance, and hence the warpage of the substrate can be mitigated. Note that after the support substrate is bonded to the piezoelectric single crystal substrate, the thermally synthesized silica layer on the back surface of the support substrate may be appropriately removed using hydrofluoric acid, for example.

(28) In the present invention, an amorphous silicon layer may be further deposited on at least one of the surface of the first intermediate layer and the surface of the second intermediate layer, and then the first intermediate layer may be bonded to the second intermediate layer. With this configuration, the joining strength can be improved, and cracks or peeling can hardly occur. (29) At this time, a total thickness of the amorphous silicon layer may be 50 nm or less. With this configuration, an out gas generated on the second intermediate layer side can be excellently transmitted on the first intermediate layer side.

(30) In the present invention, an activation process may be applied to at least one surface of the first intermediate layer and the second intermediate layer, and then the surface of the first intermediate layer may be bonded to the surface of the second intermediate layer. (31) The surface activation process may be any one of ozone water treatment, UV ozone treatment, ion beam treatment, and plasma treatment. By the surface activation process, firm bonding can be implemented.

(32) In the present invention, the surface of the first intermediate layer and/or the surface of the second intermediate layer may be flattened by chemical-mechanical polishing.

(33) In the present invention, a material of the second intermediate layer may include any one of SiOx, $Al_2O_3$, AlN, SiN, SiON, and $Ta_2O_5$. The above-mentioned substances are preferable because the substances can be deposited and processed by CVD and PVD, for example, at a temperature of 500° C. or less that is relatively low temperature.

(34) In the present invention, the second intermediate layer may be formed by chemical vapor deposition (CVD). (35) Alternatively, the second intermediate layer may be formed by physical vapor deposition (PVD). (36) Alternatively, the second intermediate layer may be formed in which a solution of an organic silicon compound is applied and the applied organic silicon compound is hardened.

(37) In the present invention, the step of performing a process of ion implantation into the piezoelectric single crystal substrate is included prior to the step of bonding, and peeling may be performed at an interface in a region in which the ion is implanted after the step of bonding. (38) In the step of performing the ion implantation process, a hydrogen ion may be implanted in an amount of $6.0 \times 10^{16}$ atoms/cm$^2$ to $2.75 \times 10^{17}$ atoms/cm$^2$. (39) Alternatively, in the step of performing the ion implantation process, a hydrogen molecule ion may be implanted in an amount of $3.0 \times 10^{16}$ atoms/cm$^2$ to $1.37 \times 10^{17}$ atoms/cm$^2$.

(40) In the step of peeling, mechanical peeling may be performed along a region in which the ion is implanted. (41) Alternatively, in the step of peeling, peeling may be performed using a flash lamp annealing.

(42) In the present invention, the step of grinding and/or polishing the piezoelectric single crystal substrate to reduce a thickness may be included after the step of bonding.

DESCRIPTION OF EMBODIMENTS

Figure 1:
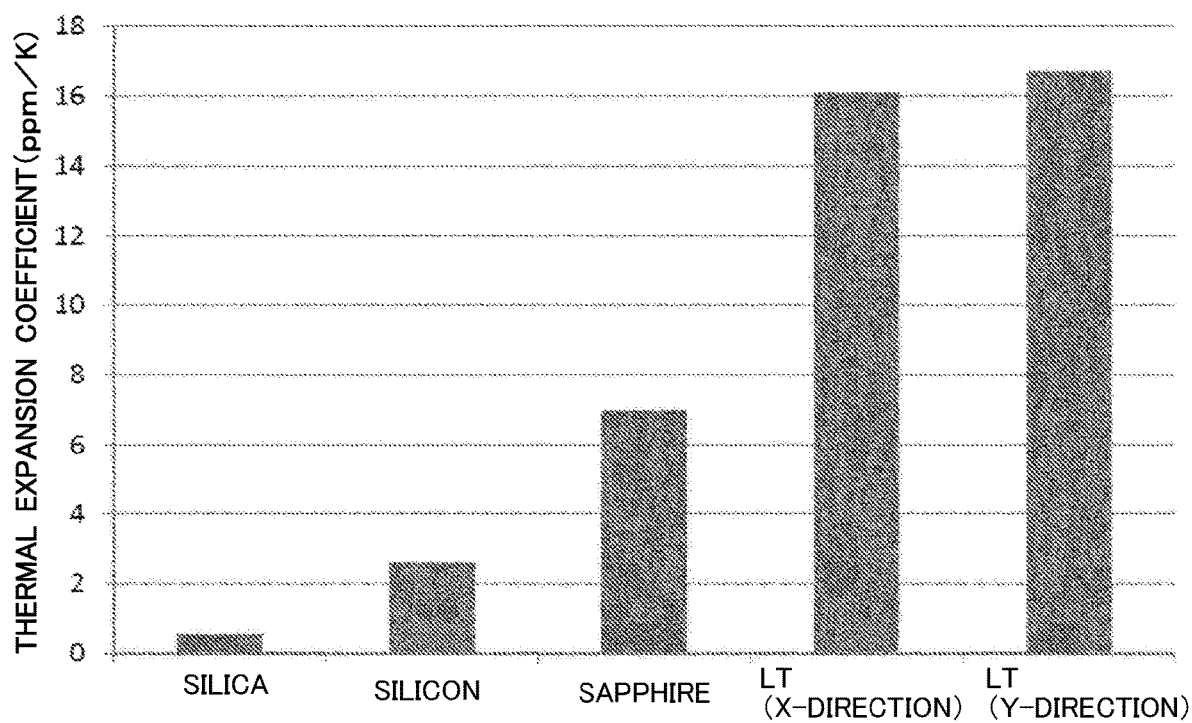
FIG. 1 is a graph of thermal expansion coefficients of various materials in comparison.
Figure 2:
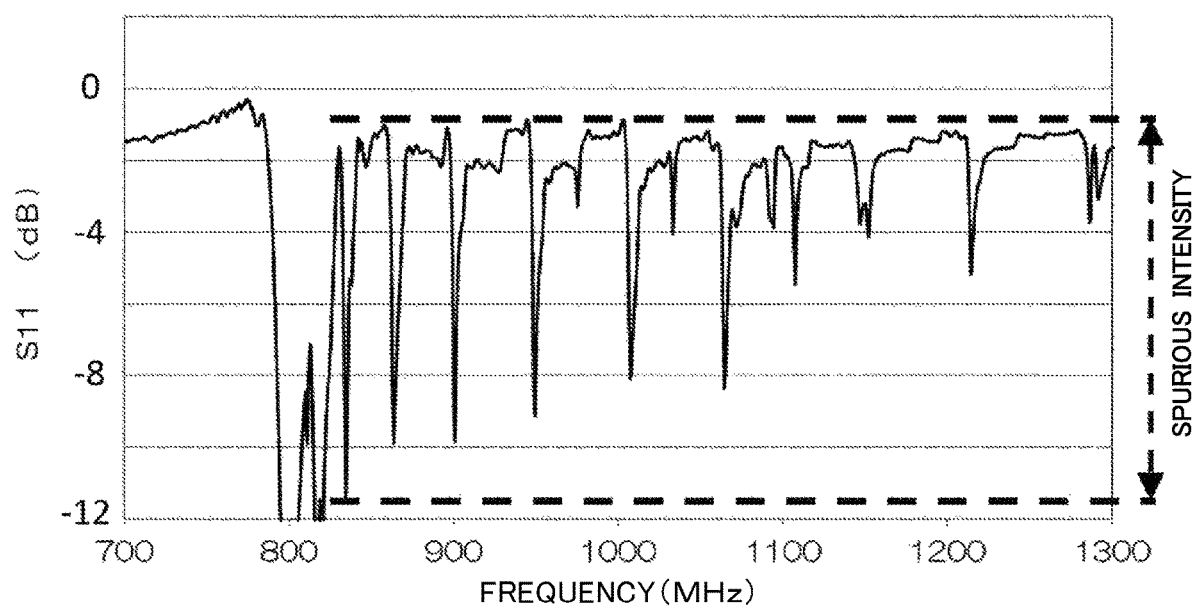
FIG. 2 shows a spectrum of the reflection coefficient of a resonator prepared from a conventional composite substrate.
Figure 3:
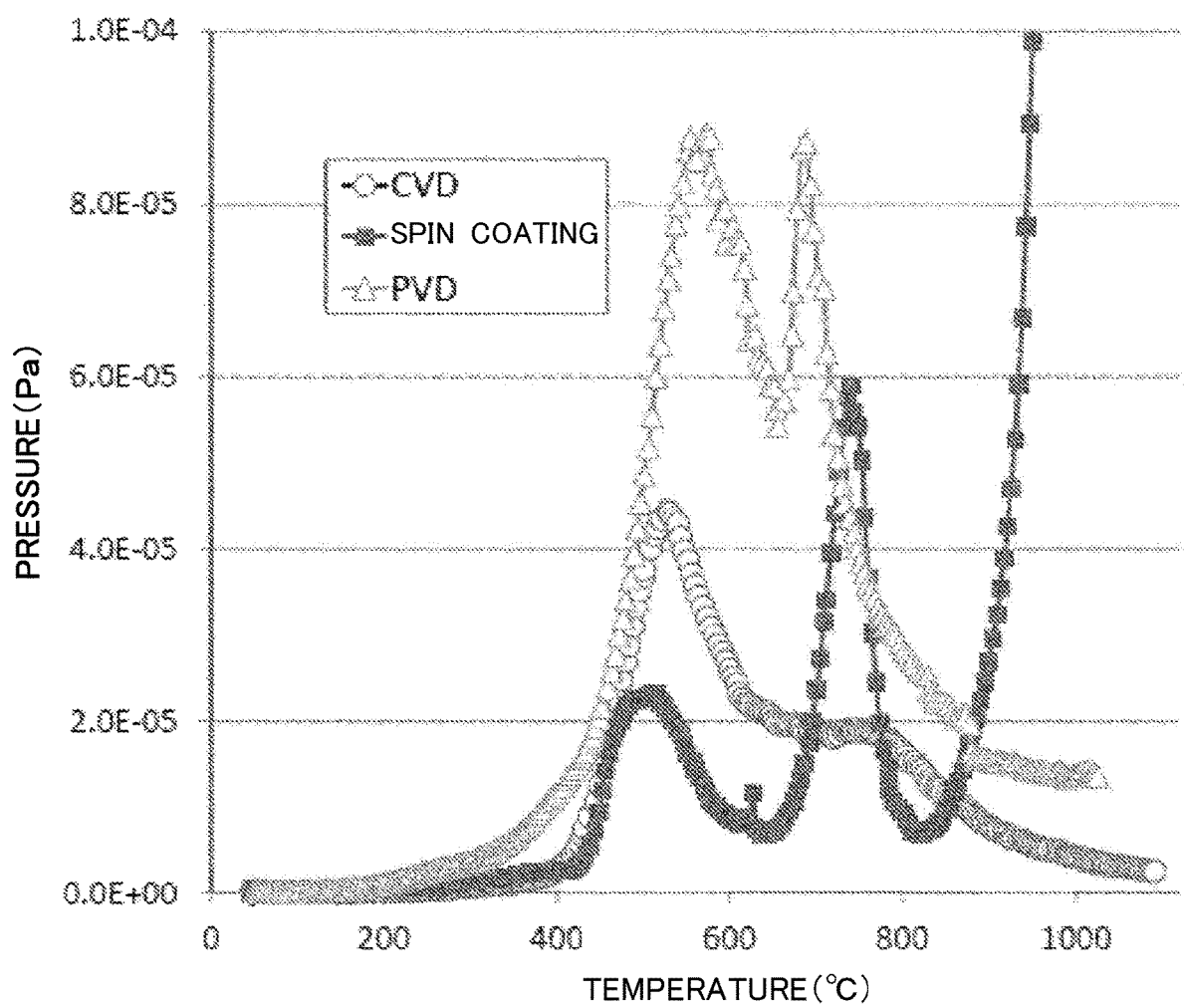
FIG. 3 shows the temperature dependence of amounts of out gas emission from intermediate layers.
Figure 4:
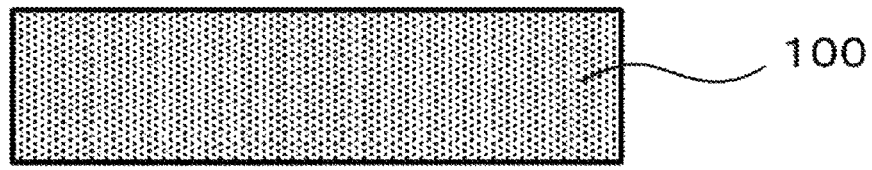
FIG. 4 shows a processing method of a support substrate before bonding.
Figure 4:
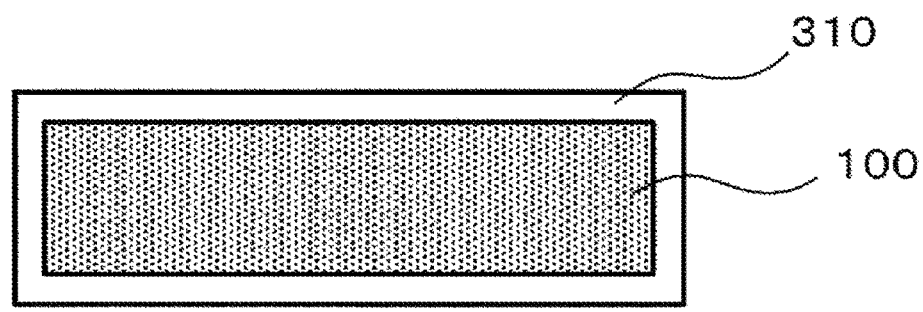
Figure 4:
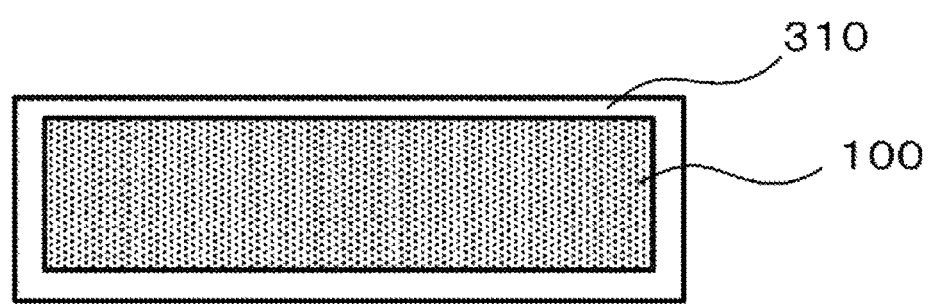

A composite substrate 1 according an embodiment is manufactured through processes in which a support substrate 100 and a piezoelectric single crystal substrate 200 are processed before bonding and then these two substrates are bonded to each other. In the following, manufacturing methods will be described with reference to FIGS. 4 to 6.

[Process of the Support Substrate]

First, the support substrate 100 is prepared (FIG. 4(a)). The support substrate 100 is selected from silicon, sapphire, silicon carbide, silicon nitride, aluminum nitride, and silica glass.

Subsequently, a first intermediate layer 310 including thermally synthesized silica is formed on the surface of the support substrate 100 (FIG. 4(b)). At this time, a thermally synthesized silica layer having the same material as the first intermediate layer 310 may be formed on the back surface of the support substrate 100. Note that after the support substrate 100 is bonded to the piezoelectric single crystal substrate 200, the silica layer on the back surface may be appropriately removed using hydrofluoric acid, for example. In the case in which the material of the support substrate 100 is silicon, a thermally oxidized silica film to be the first intermediate layer 310 can be formed by thermal oxidation of a silicon substrate. Since thermally oxidized silica is grown at high temperature, the thermally oxidized silica has the properties of being fine with few impurities and can absorb gases to some extent.

The first intermediate layer 310 can be formed by methods below regardless of whether the material of the support substrate 100 is silicon or not. That is, the first intermediate layer 310 may be formed by sintering a silica layer deposited by chemical vapor deposition (CVD) at a temperature of 800° C. or more. The first intermediate layer 310 may be formed by sintering a silica layer deposited by physical vapor deposition (PVD) at a temperature of 800° C. or more. Alternatively, the first intermediate layer 310 may be formed in which a solution of an organic silicon compound is applied and then sintered at a temperature of 800° C. or more. In the case in which the first intermediate layer 310 is formed in a silica sintered body, a heat resistant substrate is preferably used such that synthetic silica deposited on the support substrate 100 can be sintered together with the support substrate 100.

Subsequently, the surface of the first intermediate layer 310 is flattened as necessary (FIG. 4(c)). This flattening may be performed by chemical-mechanical polishing. Note that in the case in which a silicon substrate having a mirror-finished surface is used as the support substrate 100 and the first intermediate layer 310 is formed by thermal oxidation, the surface of the first intermediate layer 310 has a mirror surface similar to the base, and hence this flattening process is unnecessary.

Although not shown in the drawings, processes below may be performed as necessary in order to improve joining strength in bonding. For example, amorphous silicon may be deposited on the surface of the first intermediate layer 310. Stacking amorphous silicon makes the bonding interface that is Si/SiO$_2$ or Si/Si, and this provides joining strength slightly higher than SiO$_2$/SiO$_2$ bonding (see detail, Tong Q. Y. and Gosele U., Semiconductor Wafer Bonding, Science and Technology, Chapter 4.7.1, 1999). The thickness of the amorphous silicon to be deposited is preferably 50 nm or less such that gas transmission is not inhibited. The surface of the first intermediate layer 310 may be subjected to activation. The surface activation process may be any one of ozone water treatment, UV ozone treatment, ion beam treatment, and plasma treatment, for example.

With the processes above, the processes before bonding for the support substrate 100 is finished.

[Processes of the Piezoelectric Single Crystal Substrate]

Figure 5:
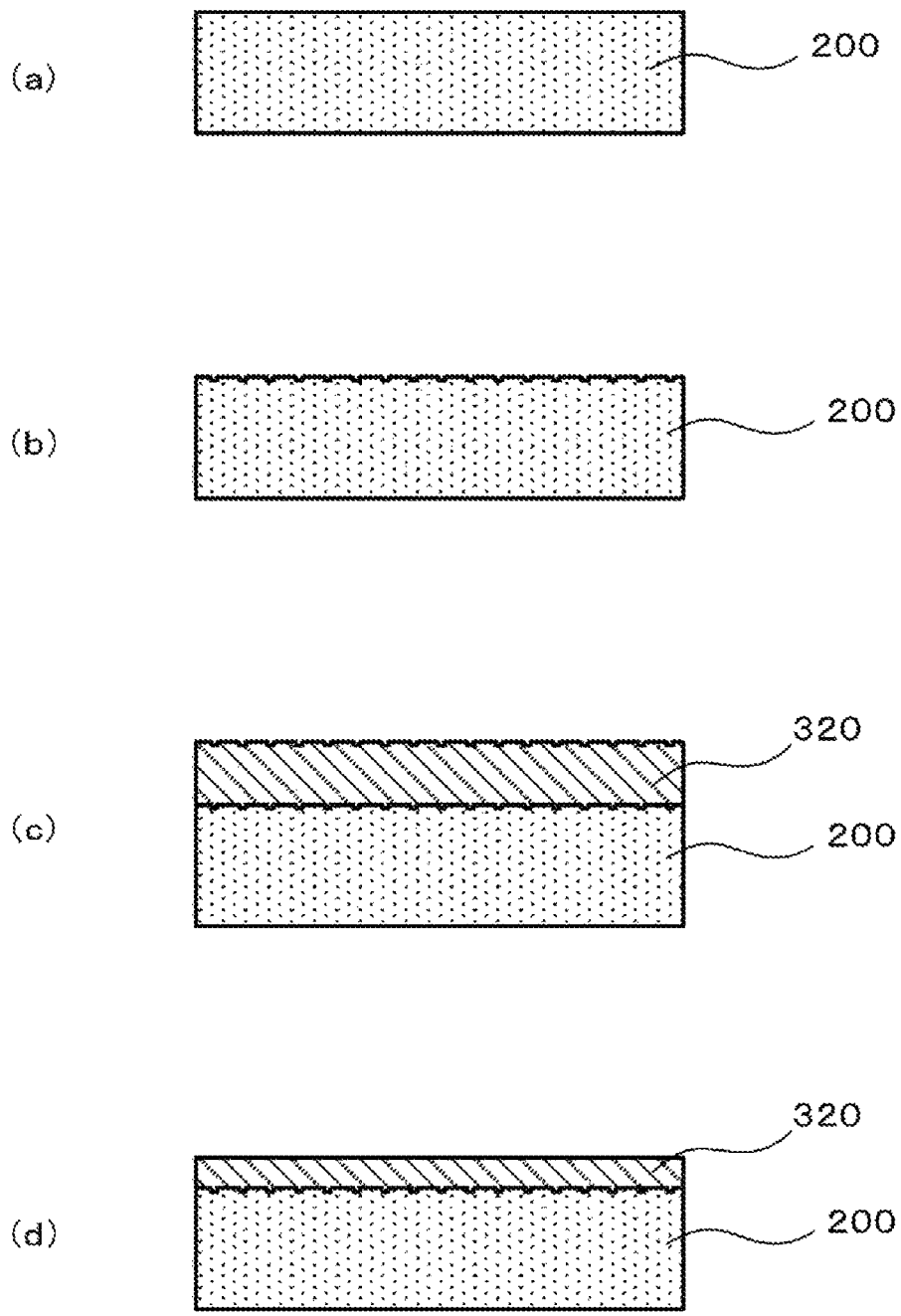
FIG. 5 shows a processing method of a piezoelectric single crystal substrate before bonding.

First, the piezoelectric single crystal substrate 200 is prepared (FIG. 5 (a)). The piezoelectric single crystal substrate 200 is a piezoelectric single crystal, such as lithium tantalate (LT) and lithium niobate (LN). Subsequently, irregularities are formed on the surface of the piezoelectric single crystal substrate 200 as necessary (FIG. 5 (b)). The irregularities have the effect that suppresses the spurious phenomenon of a resonator prepared from the composite substrate 1. In the case in which the composite substrate 1 is used for the application that spuriousness causes no problem, this process may be omitted.

Subsequently, a second intermediate layer 320 is formed by depositing the second intermediate layer 320 including an inorganic material on the surface of the piezoelectric single crystal substrate 200 (FIG. 5 (c)). The material of the second intermediate layer 320 includes any one of SiOx (e.g. SiO$_2$), Al$_2$O$_3$, AlN, SiN, SiON, and Ta$_2$O$_5$. The second intermediate layer 320 can be formed by methods below. That is, the second intermediate layer 320 may be deposited by chemical vapor deposition (CVD). The second intermediate layer may be deposited by physical vapor deposition (PVD). Alternatively, the second intermediate layer 320 may be deposited in which a solution of an organic silicon compound is applied and then hardened. In order to reduce residual gases, the second intermediate layer 320 formed by any one of the methods may be heated at a temperature lower than the Curie temperature of the piezoelectric crystal. In order to prevent the second intermediate layer 320 from cracking due to the difference in the thermal expansion coefficient between the piezoelectric single crystal substrate 200 and the second intermediate layer 320, a heating temperature is preferably at a temperature of 600° C. or less. The second intermediate layer 320 may be configured in which the layer 320 has at least two layers having different materials.

Subsequently, the surface of the formed second intermediate layer 320 is flattened (FIG. 5 (d)). This flattening may be performed by chemical-mechanical polishing.

Although not shown in the drawings, processes below may be performed as necessary in order to improve joining strength in bonding. For example, amorphous silicon may be deposited on the surface of the second intermediate layer 320. The thickness of the amorphous silicon to be deposited is preferably 50 nm or less such that gas transmission is not inhibited. Note that in the case in which amorphous silicon is also deposited on the first intermediate layer 310, the total thickness may be 50 nm or less. The surface of the second intermediate layer 320 may be subjected to activation. The surface activation process may be any one of ozone water treatment, UV ozone treatment, ion beam treatment, and plasma treatment, for example.

With the processes above, the processes for the piezoelectric single crystal substrate 200 before bonding are finished.

[Bonding and Processes after Bonding]

Figure 6:
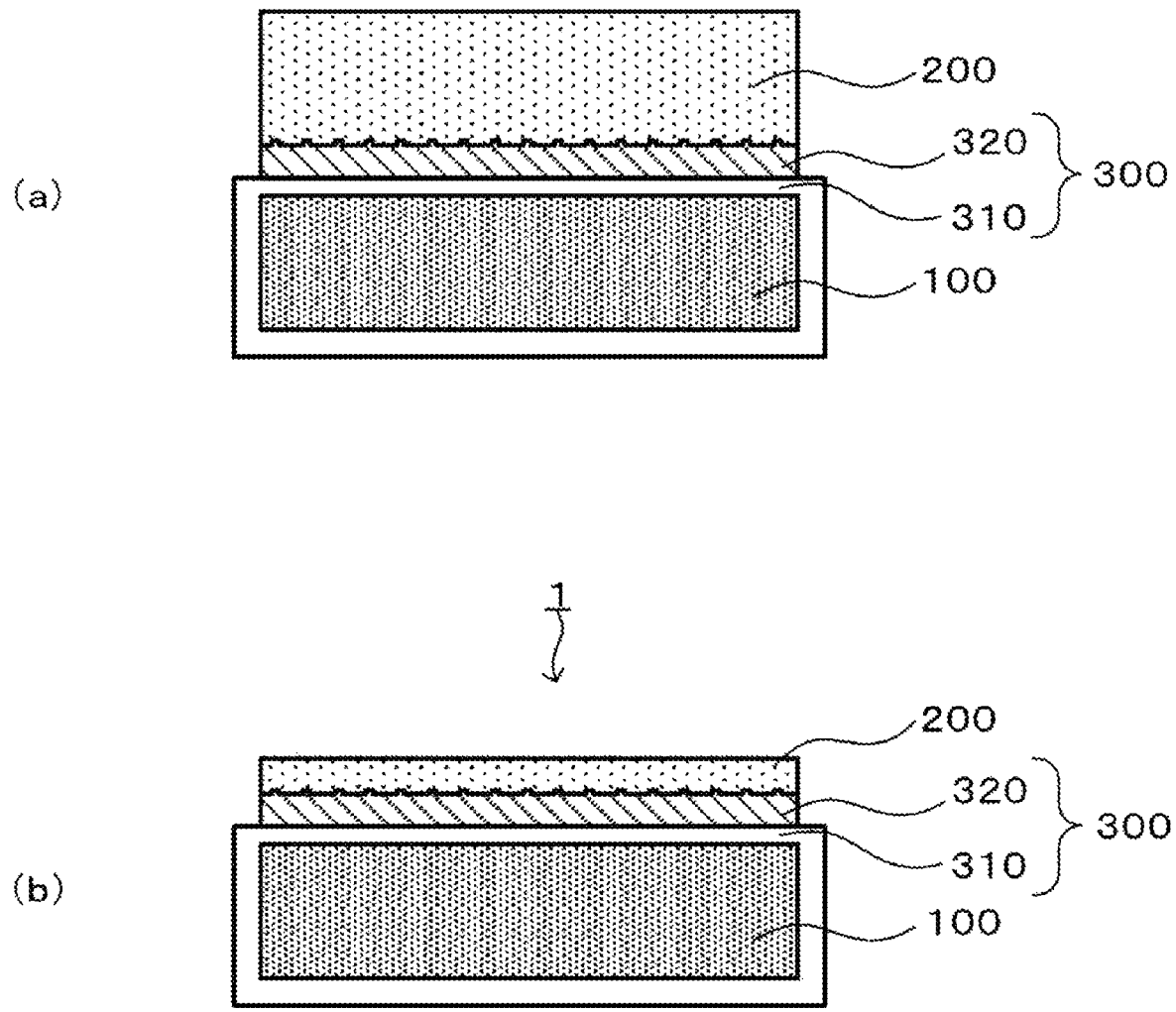
FIG. 6 shows a bonding method and a processing method after bonding.

On the support substrate 100 and the piezoelectric single crystal substrate 200 processed as described above, the surface of the first intermediate layer 310 is bonded to the surface of the second intermediate layer 320 (FIG. 6 (a)). At this time, joining strength may be improved by heating the bonded substrates at a low temperature (e.g., 120° C.)

Figure 7:
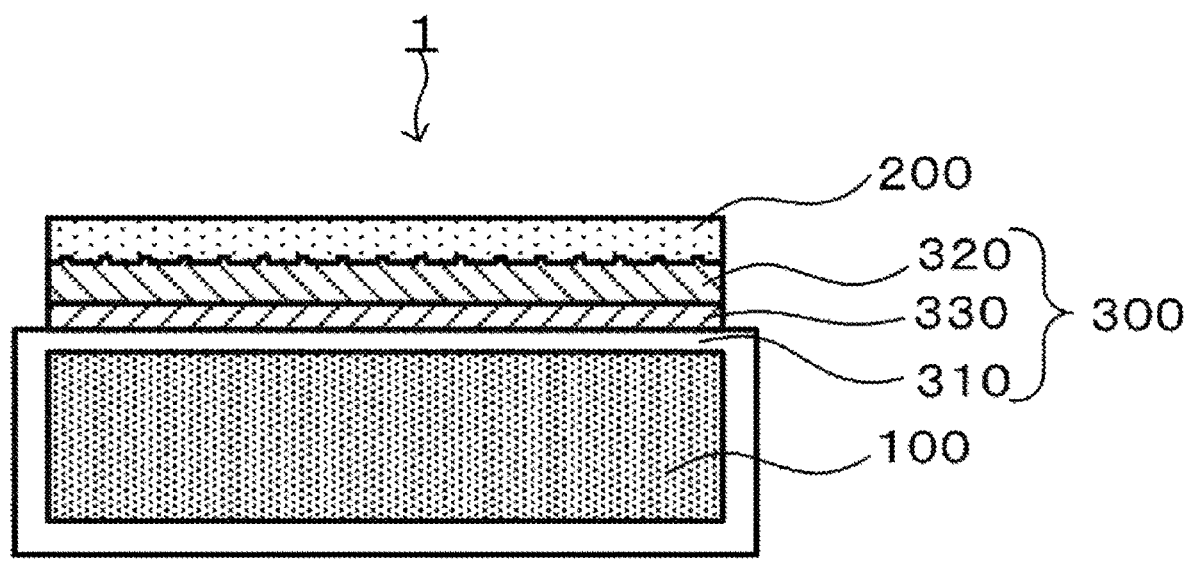
FIG. 7 schematically shows the structure of a composite substrate provided with an amorphous silicon layer between a first intermediate layer and a second intermediate layer.

Subsequently, the piezoelectric single crystal substrate 200 is ground and polished to reduce the thickness. For example, the thickness of the piezoelectric single crystal substrate 200 is reduced to a thickness of about 20 µm (FIG. 6 (b)). After that, additional heat treatment is performed further as necessary, and joining force may be reinforced. The first intermediate layer 310 and the second intermediate layer 320 thus bonded and joined configure an intermediate layer 300. As shown in FIG. 7, in the configuration of the composite substrate 1 provided with an amorphous silicon layer (a third intermediate layer) 330 between the first intermediate layer 310 and the second intermediate layer 320, the first intermediate layer 310, the second intermediate layer 320, and the third intermediate layer 330 configure the intermediate layer 300.

By the manufacturing method described above, the composite substrate 1 having the piezoelectric single crystal substrate 200 joined to the support substrate 100 with the intermediate layer 300 sandwiched can be manufactured.

[Evaluation of the Surface Acoustic Wave Properties]

On the surface of the piezoelectric single crystal substrate 200 of the prepared composite substrate 1, an aluminum (Al) thin film in a thickness of 0.4 µm was sputtered, electrodes were formed by photolithography, and then a four-stage rudder filter formed of a two-stage parallel resonators and a four-stage series resonator at a wavelength of 5 µm and a resonator were prepared. For photolithographic exposure, a g-line stepper was used, and for Al etching, a mixed gas of Cl$_2$, BCl$_3$, N$_2$, and CF$_4$ was used. With the use of a network analyzer, the reflection coefficient (S11) of the prepared four-stage rudder filter was measured. The difference between the peak and bottom of observed spuriousness was evaluated as spurious intensity.

The relationship between the Q-value and the resonance frequency of the prepared resonator was found by Equation (1) below.

[Equation 1]

$$Q = \frac{\omega \cdot \tau \cdot |S_{11}|}{1 - |S_{11}|^2} \quad (1)$$

Here, ω is the angular frequency, and τ is the group delay time. The Q-value is the value indicating the sharpness of the waveform of resonance, and a filter having a higher Q value can be of excellent properties with a small loss. Since the Q-value has frequency dependency, the maximum value ($Q_{max}$) of the Q-value was evaluated.

EXAMPLES

Example 1

An LT substrate in a diameter of six inches having a roughness of about 230 nm (in P-V, about 1.7 µm) at Ra (arithmetic average roughness) was prepared as a piezoelectric single crystal substrate. On the LT substrate, an SiO$_2$ film was formed by deposition in a thickness of about 10 µm by plasma CVD using silane and oxygen gas as raw material gases. This SiO$_2$ film was subjected to heat treatment at a temperature of about 400° C., the surface was polished and mirror-finished, and the SiO$_2$ film was finished in a film thickness of about 2 µm.

Figure 8:
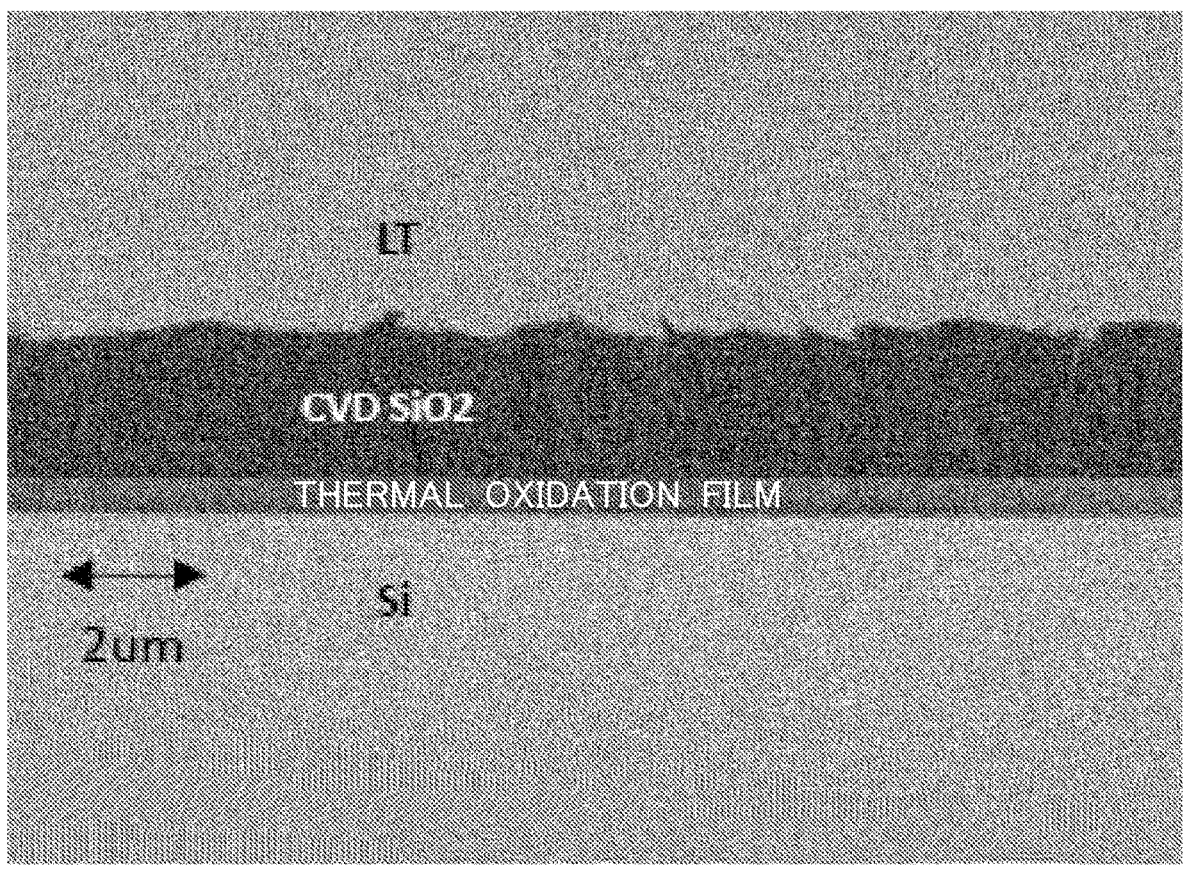
FIG. 8 shows the cross section of a microphotograph of a composite substrate prepared in Example 1.

An Si substrate in a diameter of six inches having a thermal oxidation film grown in a thickness of 500 nm was prepared as a support substrate. After that, plasma surface activation was applied to both of the LT substrate deposited with the SiO$_2$ film and the Si substrate having the thermal oxidation film grown. The two substrates were bonded to each other and subjected to heat treatment at a temperature of 120° C., and then the LT was ground and polished to reduce the thickness to about 20 The cross section of a microphotograph of the composite substrate thus finished is shown in FIG. 8.

A heat resistance test was examined in which the wafer of the composite substrate was diced in two-millimeter squares and reciprocated between a hot plate at a temperature of 200° C. and a metal cooling stage (the substrate was held for 30 seconds each on the hot plate and on the cooling stage). The wafer was reciprocated for 100 times. However, peeling, for example, was not observed.

Note that the similar experiment was performed in which an oxide film was formed on the surface of a mirror-finished LT substrate under the same conditions. However, the entirely similar result was obtained regarding heat resistance. In the case of applications in which spuriousness causes no problem, an oxide film was formed on the mirror-finished LT substrate for performing the similar methods, and hence this shown that the present invention is applicable as it is.

Comparative Example 1

An experiment similar to Example 1 was performed using an LT substrate provided with an SiO$_2$ film similarly to Example 1 and an Si substrate without thermal oxidation. As a result of a heat resistance test similar to Example 1, peeling was observed at edges in the fifth reciprocation. With the comparison between Example 1 and Comparative Example 1, the LT substrate provided with the SiO$_2$ film by plasma CVD was bonded to the Si substrate having the thermal oxidation film grown, and hence it was shown that peeling can be suppressed compared with the case in which the Si substrate with no thermal oxidation film grown is bonded.

Example 2

An LT substrate in a diameter of six inches having a roughness of about 230 nm (in P-V, about 1.7 µm) in Ra was prepared. On the LT substrate, a process was repeated for a plurality of times in which a solution of an organic silicon compound was spin-coated and heated at a temperature of 350° C., and hence an SiO$_2$ layer in a thickness of about 5 µm was obtained. The solution of the organic silicon compound used here is two types of perhydropolysilazane (a solvent was dibutylether) and methyltrimethoxysilane (a solvent was propylene glycol monoethyl ether).

After heat treatment at a temperature of about 400° C., the surface of this SiO$_2$ film was polished and mirror-finished. An Si substrate in a diameter of six inches having a thermal oxidation film grown in a thickness of 500 nm was prepared. Plasma surface activation was applied to the two substrates. The two substrates were bonded to each other and subjected to heat treatment at a temperature of 120° C., the LT was ground and polished to reduce the thickness to 20 µm, and then a composite substrate was obtained.

A heat resistance test was examined in which the wafer of the composite substrate was diced in two-millimeter squares and reciprocated between a hot plate at a temperature of 200° C. and a metal cooling stage (the substrate was held for 30 seconds each on the hot plate and on the cooling stage). The wafer was reciprocated for 100 times. However, peeling, for example, was not observed.

Comparative Example 2

An experiment similar to Example 2 was performed using an LT substrate provided with an SiO$_2$ film similarly to Example 2 and an Si substrate without thermal oxidation. As a result of a heat resistance test similar to Example 2, peeling was observed at edges in the seventh reciprocation. With the comparison between Example 2 and Comparative Example 2, the LT substrate provided with the SiO$_2$ film by spin-coating and heating the solution of the organic silicon compound was bonded to the Si substrate having the thermal oxidation film grown, and hence it was shown that peeling can be suppressed compared with the case in which the Si substrate with no thermal oxidation film grown is bonded.

Example 3

An LT substrate in a diameter of six inches having a roughness of about 230 nm (in P-V, about 1.7 µm) in Ra was prepared. On the LT substrate, an SiO$_2$ film was deposited in a thickness of about 10 µm by PVD (here, magnetron sputtering). After heat treatment at a temperature of about 400° C., the surface of this SiO$_2$ film was polished and mirror-finished. An Si substrate in a diameter of six inches having a thermal oxidation film grown in a thickness of 500 nm was prepared. Plasma surface activation was applied to the two substrates. The two substrates were bonded to each other and subjected to heat treatment at a temperature of 120° C., the LT was ground and polished to reduce the thickness to 20 µm, and then a composite substrate was obtained.

A heat resistance test was examined in which the wafer of the composite substrate was diced in two-millimeter squares and reciprocated between a hot plate at a temperature of 200° C. and a metal cooling stage (the substrate was held for 30 seconds each on the hot plate and on the cooling stage). The wafer was reciprocated for 100 times. However, peeling, for example, was not observed.

Comparative Example 3

An experiment similar to Example 3 was performed using an LT substrate provided with an SiO$_2$ film similarly to Example 3 and an Si substrate without thermal oxidation. As a result of a heat resistance test similar to Example 3, peeling was observed at edges in the second reciprocation. With the comparison between Example 3 and Comparative Example 3, the LT substrate provided with the $SiO_2$ film by PVD was bonded to the Si substrate having the thermal oxidation film grown, and hence it was shown that peeling can be suppressed compared with the case in which the Si substrate with no thermal oxidation film grown is bonded.

Example 4

A plurality of LT substrates in a diameter of six inches having a roughness of about 230 nm (in P-V, about 1.7 μm) in Ra was prepared. On the prepared LT substrates, an $SiO_2$ film was deposited in a thickness of about 10 μm by plasma CVD. Heat treatment at a temperature of about 400° C. was applied to the $SiO_2$ film, the surface was polished and mirror-finished, and then amorphous silicon (a-Si) was deposited in various thicknesses as shown in Table 1. The amorphous silicon was deposited by varying thicknesses by PVD (magnetron sputtering) and by CVD. Plasma surface activation was applied to both of the LT substrate and the Si substrate in a diameter of six inches having the thermal oxidation film grown in a thickness of 500 nm. The two substrates were bonded to each other and subjected to heat treatment at a temperature of 120° C., the LT was ground and polished to reduce the thickness to 20 μm, and then a composite substrate was obtained.

A heat resistance test was examined in which the wafer of the obtained composite substrate was diced in two-millimeter squares and reciprocated between a hot plate at a temperature of 200° C. and a metal cooling stage (the substrate was held for 30 seconds each on the hot plate and on the cooling stage). The result is shown in Table 1. It is shown that after the thickness of the amorphous silicon exceeds 50 nm both by PVD and by CVD, the resistance is rapidly degraded. It is considered that gases generated from $SiO_2$ on the LT side fail to transmit the amorphous silicon film due to an increase in the thickness of the amorphous silicon and the absorption of the gasses to the Si thermal oxidation film is inhibited.

Example 5

Amorphous silicon was deposited on the side of an Si substrate having a thermal oxidation film grown, not on the LT substrate side, and an experiment similar to Example 4 was performed. The result was almost the same as the result in Example 4. From the result, it was shown that amorphous silicon can be provided on any of the LT substrate side and the Si substrate side.

Example 6

Amorphous silicon was deposited on both of an LT substrate and an oxidation Si substrate side, and an experiment similar to Example 4 was performed. The thickness of the amorphous silicon was the total thickness of the amorphous silicon films deposited on both substrates. The result was almost the same as the result in Example 4. From the result, it was shown that amorphous silicon can be provided on both of the LT substrate side and the Si substrate side.

Example 7

The experiment was performed as the surface activation method was changed to ozone water treatment, UV ozone treatment, and ion beam treatment. However, no difference was found in the results of bonding. It is thought that the present invention does not strongly depend on activation methods. No great difference was observed when surface activation was applied to only one substrate.

Example 8

Figure 9:
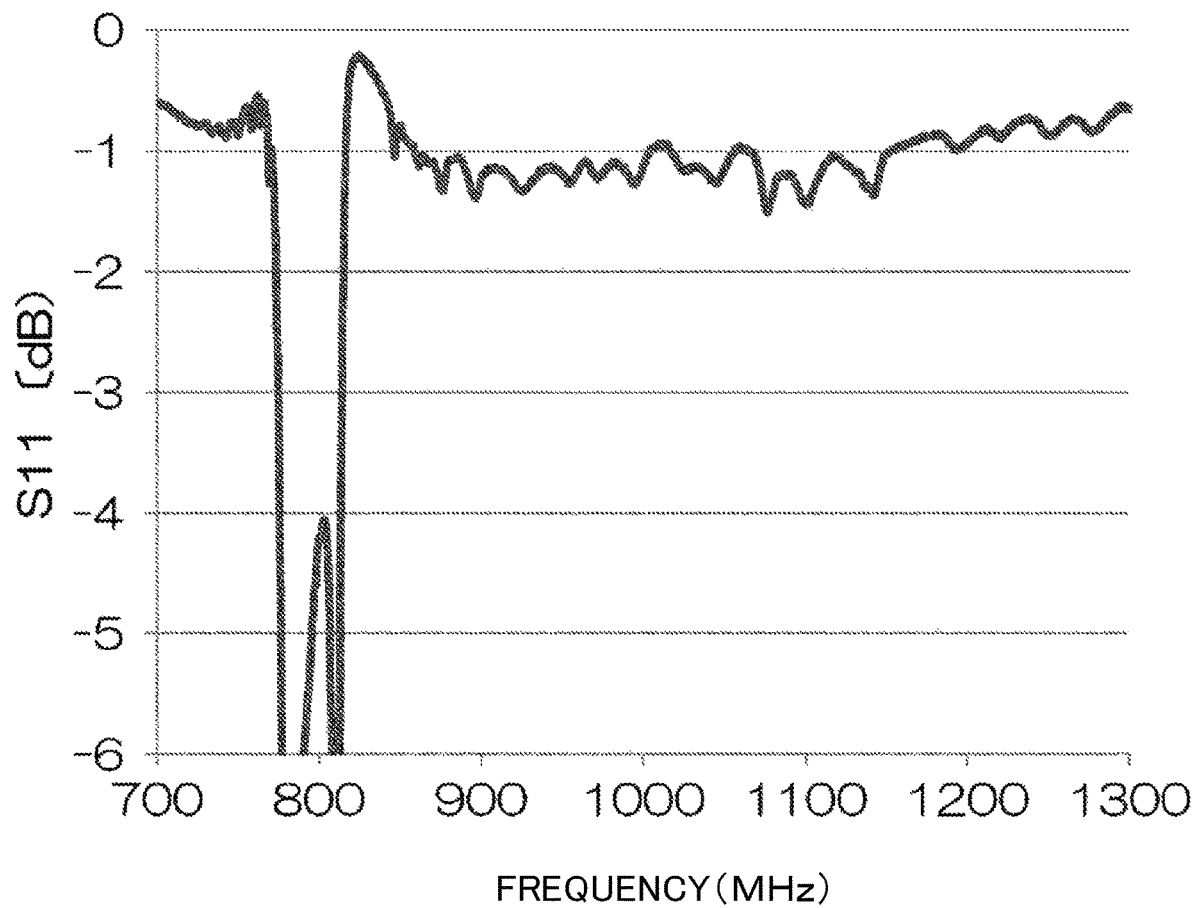
FIG. 9 shows a spectrum of the reflection coefficient of a resonator prepared in Example 8.

A four-stage rudder filter was formed on a composite substrate prepared by the method in Example 1, the spectrum of the reflection coefficient (S11) was measured, and the spurious properties were evaluated. As a result, as shown in FIG. 9, it was confirmed that spurious strength is 1 dB or less. It was revealed that the resonator prepared by this method can effectively reduce spuriousness.

Example 9

An experiment similar to Example 1 was performed by changing the thickness of a thermal oxidation film grown on an Si substrate. As a result, an effect was confirmed in the thermal oxidation films in a thickness of 20 nm or more. However, in thermal oxidation films in a thickness of less than 20 nm, out gas absorption capability was insufficient, and peeling was sometimes observed in heating and cooling cycle tests.

Example 10

An experiment similar to Example 1 was performed by changing the thickness of an $SiO_2$ film deposited on an LT substrate. The result is shown in Table 2. The thickness of the deposited $SiO_2$ shown in Table 2 is the thickness after the surface was flattened. This result revealed that when the thickness of the $SiO_2$ film (only the deposited film, the thermal oxidation film is not included) exceeds 25 μm, cracks were generated in the LT layer. It is thought that the cracks were generated by stress due to the difference in the expansion coefficient between LT and $SiO_2$. In the case in which the thickness of $SiO_2$ is 25 μm or less, $SiO_2$ can be deformed following the difference in the expansion coefficient to some extent. However, it is thought that when the thickness is 25 μm or more, cracks are generated due to stress relaxation.

TABLE 1

| | a-Si Thickness (nm) | | | | | | | | | |
|---|---|---|---|---|---|---|---|---|---|---|
| | 3 | 5 | 10 | 20 | 35 | 50 | 65 | 80 | 80 | 100 |
| PVD | >100Times | >100Times | >100Times | >100Times | >100Times | >100Times | 75Times | 52Times | 12Times | 3Times |
| CVD | >100Times | >100Times | >100Times | >100Times | >100Times | >100Times | 19Times | 11Times | 5Times | 2Times |

TABLE 2

| | Thickness of deposited SiO$_2$ (μm) | | | | | | |
|---|---|---|---|---|---|---|---|
| | 1 | 2 | 5 | 10 | 20 | 25 | 30 |
| Crack generation state | No crack | No crack | No crack | No crack | No crack | Some cracks on edges | Cracks observed on whole wafer |

Example 11

An LT substrate in a diameter of six inches having a mirror-finished surface on one side was prepared. On the mirror surface side of the LT substrate, an Al$_2$O$_3$ film was deposited in a thickness of 1 μm by sputtering. On the Al$_2$O$_3$ film of the Al$_2$O$_3$ film attached LT substrate, an SiO$_2$ film was deposited in a thickness of about 10 μm by plasma CVD using silane and oxygen gas as raw material gases. The film stack of Al$_2$O$_3$ and SiO$_2$ was subjected to heat treatment at a temperature of about 400° C., the surface was polished and mirror-finished, and the SiO$_2$ film was finished in a film thickness of about 2 μm.

An Si substrate in a diameter of six inches having a thermal oxidation film grown in a thickness of 500 nm was prepared. Plasma surface activation was applied to the two substrates. The two substrates were bonded to each other and subjected to heat treatment at a temperature of 120° C., the LT was ground and polished to reduce the thickness to about 6 μm, and then a composite substrate was obtained.

A heat resistance test was examined in which the wafer of the composite substrate was diced in two-millimeter squares and reciprocated between a hot plate at a temperature of 200° C. and a metal cooling stage (the substrate was held for 30 seconds each on the hot plate and on the cooling stage). The wafer was reciprocated up to 200 reciprocations. However, peeling, for example, was not observed. From the example, it was shown that a multi-layered intermediate layer (i.e., the second intermediate layer) may be provided on the LT substrate side before bonding.

Example 12

An LT substrate in a diameter of six inches having a roughness of about 230 nm (in P-V, about 1.7 μm) at Ra (arithmetic average roughness) was prepared. On the LT substrate, an SiO$_2$ film was formed by deposition in a thickness of about 10 μm by plasma CVD using silane and oxygen gas as raw material gases. This SiO$_2$ film was subjected to heat treatment at a temperature of about 400° C., the surface was polished and mirror-finished, and the SiO$_2$ film was finished in a film thickness of about 2 μm.

A sapphire substrate in a diameter of six inches was prepared, and on the substrate, an SiO$_2$ film was deposited in a thickness of about 5 μm by plasma CVD. The SiO$_2$ film on the sapphire substrate was sintered by heat treatment at a temperature of 800° C., the surface was polished and mirror-finished, and the SiO$_2$ film was finished in a film thickness of 1 μm.

A plasma activation process was applied to both of the SiO$_2$ film deposited on the LT substrate and the sintered SiO$_2$ film deposited on the sapphire substrate, the two substrates were bonded to each other and subjected to heat treatment at a temperature of 120° C., the LT was ground and polished to reduce the thickness to 20 μm, and then a composite substrate was obtained.

A heat resistance test was examined in which the wafer of the composite substrate was diced in two-millimeter squares and reciprocated between a hot plate at a temperature of 200° C. and a metal cooling stage (the substrate was held for 30 seconds each on the hot plate and on the cooling stage). The wafer was reciprocated for 100 times. However, peeling, for example, was not observed. From the example, it was shown that a sapphire substrate can be used as a support substrate. It was shown that thermally synthesized silica obtained by heating and sintering SiO$_2$ deposited by CVD can be used for an intermediate layer (i.e., the first intermediate layer) provided on the support substrate side before bonding.

Example 13

An LT substrate in a diameter of six inches having a roughness of about 230 nm (in P-V, about 1.7 μm) at Ra (arithmetic average roughness) was prepared. On the LT substrate, an SiO$_2$ film was formed by deposition in a thickness of about 10 μm by plasma CVD using silane and oxygen gas as raw material gases. This SiO$_2$ film was subjected to heat treatment at a temperature of about 400° C., the surface was polished and mirror-finished, and the SiO$_2$ film was finished in a film thickness of about 2 μm.

A sapphire substrate in a diameter of six inches was prepared, and on the substrate, an SiO$_2$ film was deposited in a thickness of about 10 μm by PVD (magnetron sputtering). The SiO$_2$ film on the sapphire substrate was sintered by heat treatment at a temperature of 900° C., the surface was polished and mirror-finished, and SiO$_2$ film was finished in a film thickness of 1 μm.

A plasma activation process was applied to both of the SiO$_2$ film deposited on the LT substrate and the sintered SiO$_2$ film deposited on the sapphire substrate, the two substrates were bonded to each other and subjected to heat treatment at a temperature of 120° C., the LT was ground and polished to reduce the thickness to 20 μm, and then a composite substrate was obtained.

A heat resistance test was examined in which the wafer of the composite substrate was diced in two-millimeter squares and reciprocated between a hot plate at a temperature of 200° C. and a metal cooling stage (the substrate was held for 30 seconds each on the hot plate and on the cooling stage). The wafer was reciprocated for 100 times. However, peeling, for example, was not observed. From the example, it was shown that a sapphire substrate can be used as a support substrate. It was shown that thermally synthesized silica obtained by heating and sintering SiO$_2$ deposited by PVD can be used for an intermediate layer (i.e., the first intermediate layer) provided on the support substrate side before bonding.

Example 14

An LT substrate in a diameter of six inches having a roughness of about 230 nm (in P-V, about 1.7 μm) at Ra (arithmetic average roughness) was prepared. On the LT substrate, an SiO$_2$ film was formed by deposition in a thickness of about 10 μm by plasma CVD using silane and oxygen gas as raw material gases. This SiO$_2$ film was subjected to heat treatment at a temperature of about 400° C., the surface was polished and mirror-finished, and the SiO$_2$ film was finished in a film thickness of about 2 μm.

A sapphire substrate in a diameter of six inches was prepared, and on the substrate, an SiO$_2$ film was deposited in a thickness of about 3 μm by repeating a process of spin coating a solution of the organic silicon compound (a dibutylether solution of perhydropolysilazane) and a process of thermosetting at a temperature of 350° C. for a few times. The SiO$_2$ film on the sapphire substrate was sintered by heat treatment at a temperature of 900° C., the surface was polished and mirror-finished, and the thickness of the SiO$_2$ film was finished to a film thickness of 0.5 μm.

A plasma activation process was applied to both of the SiO$_2$ film deposited on the LT substrate and the sintered SiO$_2$ film deposited on the sapphire substrate, the two substrates were bonded to each other and subjected to heat treatment at a temperature of 120° C., the LT was ground and polished to reduce the thickness to 20 μm, and then a composite substrate was obtained.

A heat resistance test was examined in which the wafer of the composite substrate was diced in two-millimeter squares and reciprocated between a hot plate at a temperature of 200° C. and a metal cooling stage (the substrate was held for 30 seconds each on the hot plate and on the cooling stage). The wafer was reciprocated for 100 times. However, peeling, for example, was not observed. From the example, it was shown that a sapphire substrate can be used as a support substrate. It was shown that thermally synthesized silica obtained by applying, heating, and sintering organic silicon can be used for an intermediate layer (i.e., the first intermediate layer) provided on the support substrate side before bonding.

Example 15

An LT substrate in a diameter of six inches having a roughness of about 230 nm (in P-V, about 1.7 μm) at Ra (arithmetic average roughness) was prepared. On the LT substrate, an SiO$_2$ film was formed by deposition in a thickness of about 10 μm by plasma CVD using silane and oxygen gas as raw material gases. This SiO$_2$ film was subjected to heat treatment at a temperature of about 400° C., the surface was polished and mirror-finished, and the SiO$_2$ film was finished in a film thickness of about 2 μm.

A silica glass substrate in a diameter of six inches was prepared, and on the substrate, an SiO$_2$ film was deposited in a thickness of about 3 μm by repeating a process of spin coating a solution of the organic silicon compound (a propylene glycol monoethyl ether solution of methyltrimethoxysilane) and a process of thermosetting at a temperature of 350° C. for a few times. The SiO$_2$ film on the silica glass substrate was sintered by heat treatment at a temperature of 1,000° C., the surface was polished and mirror-finished, and the thickness of the SiO$_2$ film was finished to a film thickness of 0.5 μm.

A plasma activation process was applied to both of the SiO$_2$ film deposited on the LT substrate and the sintered SiO$_2$ film deposited on the silica glass substrate, the two substrates were bonded to each other and subjected to heat treatment at a temperature of 120° C., the LT was ground and polished to reduce the thickness to 20 μm, and then a composite substrate was obtained.

A heat resistance test was examined in which the wafer of the composite substrate was diced in two-millimeter squares and reciprocated between a hot plate at a temperature of 200° C. and a metal cooling stage (the substrate was held for 30 seconds each on the hot plate and on the cooling stage). The wafer was reciprocated for 100 times. However, peeling, for example, was not observed. From the example, it was shown that a silica glass substrate can be used as a support substrate. It was shown that thermally synthesized silica obtained by applying, heating, and sintering organic silicon can be used for an intermediate layer (i.e., the first intermediate layer) provided on the support substrate side before bonding.

Example 16

A plurality of LT substrates in irregular structures having similar Ra (arithmetic average roughness) and RSm (The Mean width of profile elements (roughness) was prepared (Ra=300 nm±10%, RSm=3 μm±10%, and Rz=2.0±10%). Here, the irregular structure of the LT substrate was formed by polishing using free abrasive grains. Here, the definitions of Ra and RSm were in compliance with JIS B 0601:2001 and ISO 4287:1997, and calculated from the profiles measured using an atomic force microscope (AFM).

Subsequently, on the surface having the irregular structure of the LT substrate, SiO$_2$ was deposited in a thickness of about 10 μm at a temperature of 35° C. using plasma CVD, the surface having SiO$_2$ deposited was polished to form a mirror surface. At this time, the polishing amount was changed depending on the LT substrates, and the thickness of SiO$_2$ was from 1.5 μm to 9.5 μm.

An Si substrate to be a support substrate was subjected to heat treatment at a temperature of 850° C. in an oxygen atmosphere, and hence thermally oxidized silica in a thickness of 0.5 μm was formed on the surface of the Si substrate.

Thermally oxidized silica formed on both of the SiO$_2$ mirror surface and the surface of the Si substrate was subjected to plasma surface activation, the LT substrate was bonded to the support substrate, the LT substrate was polished, and then a composite substrate was prepared. At this time, the polishing amount was changed depending on the substrates, and the thickness of the LT substrate was 5 μm to 25 μm.

The composite substrate wafers were loaded into an oven and gradually heated, and a temperature at which the LT substrate starts peeling was measured. Electrodes were formed on the surfaces of the composite substrates, and the evaluation of the surface acoustic wave properties was performed. The evaluation results are shown in Tables 3 and 4.

TABLE 3

| Intermediate layer thickness [μm] | | | LT thickness [μm] | Peeling starting temperature [° C.] | Intermediate layer thickness/ wavelength | LT thickness/ wavelength | S11 spurious intensity [dB] | Qmax |
|---|---|---|---|---|---|---|---|---|
| Si substrate side | LT substrate side | Total | | | | | | |
| 0.5 | 1.5 | 2.0 | 5.0 | 350 | 0.4 | 1.0 | 0.20 | 4000 |
| 0.5 | 1.5 | 2.0 | 7.5 | 340 | 0.4 | 1.5 | 0.20 | 4000 |
| 0.5 | 1.5 | 2.0 | 10.0 | 320 | 0.4 | 2.0 | 0.40 | 4000 |
| 0.5 | 1.5 | 2.0 | 12.5 | 310 | 0.4 | 2.5 | 0.40 | 4000 |
| 0.5 | 1.5 | 2.0 | 15.0 | 300 | 0.4 | 3.0 | 0.40 | 4000 |
| 0.5 | 1.5 | 2.0 | 17.5 | 290 | 0.4 | 3.5 | 0.55 | 3250 |
| 0.5 | 1.5 | 2.0 | 20.0 | 280 | 0.4 | 4.0 | 0.70 | 2500 |
| 0.5 | 1.5 | 2.0 | 22.5 | 250 | 0.4 | 4.5 | 0.65 | 2150 |
| 0.5 | 1.5 | 2.0 | 25.0 | 220 | 0.4 | 5.0 | 0.60 | 1800 |
| 0.5 | 2.5 | 3.0 | 5.0 | 330 | 0.6 | 1.0 | 0.30 | 3500 |
| 0.5 | 2.5 | 3.0 | 7.5 | 335 | 0.6 | 1.5 | 0.35 | 4000 |
| 0.5 | 2.5 | 3.0 | 10.0 | 310 | 0.6 | 2.0 | 0.30 | 4000 |
| 0.5 | 2.5 | 3.0 | 12.5 | 303 | 0.6 | 2.5 | 0.28 | 4000 |
| 0.5 | 2.5 | 3.0 | 15.0 | 295 | 0.6 | 3.0 | 0.25 | 4000 |
| 0.5 | 2.5 | 3.0 | 17.5 | 283 | 0.6 | 3.5 | 0.35 | 3250 |
| 0.5 | 2.5 | 3.0 | 20.0 | 270 | 0.6 | 4.0 | 0.45 | 2500 |
| 0.5 | 2.5 | 3.0 | 22.5 | 235 | 0.6 | 4.5 | 0.63 | 2150 |
| 0.5 | 2.5 | 3.0 | 25.0 | 200 | 0.6 | 5.0 | 0.80 | 1800 |
| 0.5 | 3.5 | 4.0 | 5.0 | 320 | 0.8 | 1.0 | 0.40 | 3200 |
| 0.5 | 3.5 | 4.0 | 7.5 | 330 | 0.8 | 1.5 | 0.30 | 3800 |
| 0.5 | 3.5 | 4.0 | 10.0 | 300 | 0.8 | 2.0 | 0.20 | 4000 |
| 0.5 | 3.5 | 4.0 | 12.5 | 295 | 0.8 | 2.5 | 0.20 | 3900 |
| 0.5 | 3.5 | 4.0 | 15.0 | 290 | 0.8 | 3.0 | 0.20 | 3800 |
| 0.5 | 3.5 | 4.0 | 17.5 | 275 | 0.8 | 3.5 | 0.38 | 3150 |
| 0.5 | 3.5 | 4.0 | 20.0 | 260 | 0.8 | 4.0 | 0.55 | 2500 |
| 0.5 | 3.5 | 4.0 | 22.5 | 220 | 0.8 | 4.5 | 0.43 | 2150 |
| 0.5 | 3.5 | 4.0 | 25.0 | 180 | 0.8 | 5.0 | 0.30 | 1800 |
| 0.5 | 4.5 | 5.0 | 5.0 | 300 | 1.0 | 1.0 | 0.20 | 3000 |
| 0.5 | 4.5 | 5.0 | 7.5 | 320 | 1.0 | 1.5 | 0.20 | 3800 |
| 0.5 | 4.5 | 5.0 | 10.0 | 290 | 1.0 | 2.0 | 0.50 | 4000 |
| 0.5 | 4.5 | 5.0 | 12.5 | 288 | 1.0 | 2.5 | 0.48 | 3900 |
| 0.5 | 4.5 | 5.0 | 15.0 | 285 | 1.0 | 3.0 | 0.45 | 3800 |
| 0.5 | 4.5 | 5.0 | 17.5 | 270 | 1.0 | 3.5 | 0.38 | 3150 |
| 0.5 | 4.5 | 5.0 | 20.0 | 255 | 1.0 | 4.0 | 0.30 | 2500 |
| 0.5 | 4.5 | 5.0 | 22.5 | 213 | 1.0 | 4.5 | 0.50 | 2150 |
| 0.5 | 4.5 | 5.0 | 25.0 | 170 | 1.0 | 5.0 | 0.70 | 1800 |
| 0.5 | 5.5 | 6.0 | 5.0 | 280 | 1.2 | 1.0 | 0.30 | 2800 |
| 0.5 | 5.5 | 6.0 | 7.5 | 300 | 1.2 | 1.5 | 0.40 | 3700 |
| 0.5 | 5.5 | 6.0 | 10.0 | 280 | 1.2 | 2.0 | 0.20 | 3800 |
| 0.5 | 5.5 | 6.0 | 12.5 | 278 | 1.2 | 2.5 | 0.28 | 3750 |
| 0.5 | 5.5 | 6.0 | 15.0 | 275 | 1.2 | 3.0 | 0.35 | 3700 |
| 0.5 | 5.5 | 6.0 | 17.5 | 253 | 1.2 | 3.5 | 0.43 | 3100 |
| 0.5 | 5.5 | 6.0 | 20.0 | 230 | 1.2 | 4.0 | 0.50 | 2500 |
| 0.5 | 5.5 | 6.0 | 22.5 | 195 | 1.2 | 4.5 | 0.50 | 2150 |
| 0.5 | 5.5 | 6.0 | 25.0 | 160 | 1.2 | 5.0 | 0.50 | 1800 |

TABLE 4

| Intermediate layer thickness [μm] | | | LT thickness [μm] | Peeling starting temperature [° C.] | Intermediate layer thickness/ wavelength | LT thickness/ wavelength | S11 spurious intensity [dB] | Qmax |
|---|---|---|---|---|---|---|---|---|
| Si substrate side | LT substrate side | Total | | | | | | |
| 0.5 | 6.5 | 7.0 | 5.0 | 260 | 1.4 | 1.0 | 0.20 | 2500 |
| 0.5 | 6.5 | 7.0 | 7.5 | 275 | 1.4 | 1.5 | 0.30 | 3700 |
| 0.5 | 6.5 | 7.0 | 10.0 | 260 | 1.4 | 2.0 | 0.30 | 3600 |
| 0.5 | 6.5 | 7.0 | 12.5 | 263 | 1.4 | 2.5 | 0.30 | 3650 |
| 0.5 | 6.5 | 7.0 | 15.0 | 265 | 1.4 | 3.0 | 0.30 | 3700 |
| 0.5 | 6.5 | 7.0 | 17.5 | 243 | 1.4 | 3.5 | 0.50 | 3100 |
| 0.5 | 6.5 | 7.0 | 20.0 | 220 | 1.4 | 4.0 | 0.70 | 2500 |
| 0.5 | 6.5 | 7.0 | 22.5 | 185 | 1.4 | 4.5 | 0.63 | 2150 |
| 0.5 | 6.5 | 7.0 | 25.0 | 150 | 1.4 | 5.0 | 0.55 | 1800 |
| 0.5 | 7.5 | 8.0 | 5.0 | 240 | 1.6 | 1.0 | 0.30 | 2000 |
| 0.5 | 7.5 | 8.0 | 7.5 | 255 | 1.6 | 1.5 | 0.15 | 3600 |
| 0.5 | 7.5 | 8.0 | 10.0 | 240 | 1.6 | 2.0 | 0.40 | 3400 |
| 0.5 | 7.5 | 8.0 | 12.5 | 235 | 1.6 | 2.5 | 0.30 | 3500 |
| 0.5 | 7.5 | 8.0 | 15.0 | 230 | 1.6 | 3.0 | 0.20 | 3600 |

TABLE 4-continued

| Intermediate layer thickness [μm] | | | LT thickness [μm] | Peeling starting temperature [° C.] | Intermediate layer thickness/ wavelength | LT thickness/ wavelength | S11 spurious intensity [dB] | Qmax |
|---|---|---|---|---|---|---|---|---|
| Si substrate side | LT substrate side | Total | | | | | | |
| 0.5 | 7.5 | 8.0 | 17.5 | 215 | 1.6 | 3.5 | 0.40 | 3050 |
| 0.5 | 7.5 | 8.0 | 20.0 | 200 | 1.6 | 4.0 | 0.60 | 2500 |
| 0.5 | 7.5 | 8.0 | 22.5 | 170 | 1.6 | 4.5 | 0.75 | 2150 |
| 0.5 | 7.5 | 8.0 | 25.0 | 140 | 1.6 | 5.0 | 0.90 | 1800 |
| 0.5 | 8.5 | 9.0 | 5.0 | 230 | 1.8 | 1.0 | 0.10 | 1800 |
| 0.5 | 8.5 | 9.0 | 7.5 | 228 | 1.8 | 1.5 | 0.20 | 3500 |
| 0.5 | 8.5 | 9.0 | 10.0 | 220 | 1.8 | 2.0 | 0.50 | 3200 |
| 0.5 | 8.5 | 9.0 | 12.5 | 215 | 1.8 | 2.5 | 0.45 | 3400 |
| 0.5 | 8.5 | 9.0 | 15.0 | 210 | 1.8 | 3.0 | 0.40 | 3600 |
| 0.5 | 8.5 | 9.0 | 17.5 | 200 | 1.8 | 3.5 | 0.38 | 3000 |
| 0.5 | 8.5 | 9.0 | 20.0 | 190 | 1.8 | 4.0 | 0.35 | 2400 |
| 0.5 | 8.5 | 9.0 | 22.5 | 160 | 1.8 | 4.5 | 0.58 | 2100 |
| 0.5 | 8.5 | 9.0 | 25.0 | 130 | 1.8 | 5.0 | 0.80 | 1800 |
| 0.5 | 9.5 | 10.0 | 5.0 | 220 | 2.0 | 1.0 | 0.20 | 1600 |
| 0.5 | 9.5 | 10.0 | 7.5 | 215 | 2.0 | 1.5 | 0.30 | 3400 |
| 0.5 | 9.5 | 10.0 | 10.0 | 210 | 2.0 | 2.0 | 0.40 | 3000 |
| 0.5 | 9.5 | 10.0 | 12.5 | 205 | 2.0 | 2.5 | 0.50 | 3300 |
| 0.5 | 9.5 | 10.0 | 15.0 | 200 | 2.0 | 3.0 | 0.60 | 3600 |
| 0.5 | 9.5 | 10.0 | 17.5 | 185 | 2.0 | 3.5 | 0.60 | 3000 |
| 0.5 | 9.5 | 10.0 | 20.0 | 170 | 2.0 | 4.0 | 0.60 | 2400 |
| 0.5 | 9.5 | 10.0 | 22.5 | 145 | 2.0 | 4.5 | 0.65 | 2100 |
| 0.5 | 9.5 | 10.0 | 25.0 | 120 | 2.0 | 5.0 | 0.70 | 1800 |

These results show that wafers having an LT substrate in a smaller thickness and having an intermediate layer in a smaller thickness has higher peeling starting temperature and the wafers are of excellent heat resistance.

In the case in which heating at a temperature of 200° C. is taken into account in the post-processes, an LT substrate in a thickness of 15 μm or less is usable regardless of an intermediate layer in a thickness of 2 to 10 μm, which is preferable. In this case, when the thickness of the LT substrate is 17 μm, the total thickness of the intermediate layer is preferably 9 μm or less. When the thickness of the LT substrate is increased to 20 μm, the total thickness of the intermediate layer is preferably 8 μm or less.

In the case in which heating at a temperature of 250° C. is further taken into account in the post-processes, when the thickness of the LT substrate is 15 μm or less, the thickness of the intermediate layer is 7 μm or less, which is more preferable. When the thickness of the LT substrate is increased to 20 μm, the thickness of the intermediate layer is 6 μm or less, which is more preferable.

On the other hand, it is shown that as the thickness of the intermediate layer is smaller, the Q-value is more increased. When the thickness of the LT substrate is less than 1.5 wavelength or exceeds 3.0 wavelength, the Q-value tend to decrease.

Regardless of the thickness of the LT substrate or the thickness of the intermediate layer, the spurious intensity is suppressed as low as 1.0 dB or less.

Example 17

An LT substrate in a diameter of 100 mm and a thickness of 0.35 mm having a roughness of 20 nm in Ra (arithmetic average roughness) was prepared. On the LT substrate, a 200 nm $SiO_2$ film was deposited in a thickness of about 10 μm film by PVD, the film was polished to a thickness of 50 nm, the surface was mirror-finished. It was confirmed that the surface roughness was 1.0 nm or less in RMS. Subsequently, to the LT substrate formed with the $SiO_2$ film, hydrogen ions ($H^+$) were implanted under in which the dose amount was $7.0 \times 10^{16}$ atoms/cm$^2$ and the accelerating voltage was 100 KeV. An Si substrate is prepared as a support substrate, and the thermal oxidation film in a thickness of 500 nm was grown. A plasma activation process was applied to the LT substrate and the Si substrate, and surface activation was performed. The two substrates were bonded to each other, and subjected to heat treatment at a temperature of 100° C. for 24 hours. Subsequently, mechanical peeling was performed in which a blade in a wedge shaped was placed near the ion implantation interface on the side surface of the substrates thus bonded to each other. Thus, a composite substrate having a stack of the LT thin film in a thickness of about 600 nm on the Si substrate through the $SiO_2$ layer can be obtained. After polishing to provide a mirror surface, evaluation was performed. However, in a thermal endurance test, peeling was not observed.

Note that in Example 17, the implantation of hydrogen ions to the LT substrate can also be performed before the $SiO_2$ film is deposited. Also with this configuration, the effect similar to the case can be obtained in which the $SiO_2$ film was deposited and then hydrogen ions were implanted. When the dose amount of hydrogen ions ranges from $6.0 \times 10^{16}$ atoms/cm$^2$ to $2.75 \times 10^{17}$ atoms/cm$^2$, the similar effect can be obtained. Instead of hydrogen ions, the similar effect can be obtained by implanting hydrogen molecule ions ($H_2^+$) in the range of $3.0 \times 10^{16}$ atoms/cm$^2$ to $1.37 \times 10^{17}$ atoms/cm$^2$.

Example 18

An LT substrate in a diameter of 100 mm and a thickness of 0.35 mm having a roughness of 20 nm in Ra (arithmetic average roughness) was prepared. On the LT substrate, a 200 nm $SiO_2$ film was deposited in a thickness of about 10 μm film by PVD, the film was polished to a thickness of 50 nm, the surface was mirror-finished. It was confirmed that the surface roughness was 1.0 nm or less in RMS. Subsequently, to the LT substrate formed with the $SiO_2$ film, hydrogen ions were implanted under in which the dose amount was $7.0 \times 10^{16}$ atoms/cm$^2$ and the accelerating voltage was 100 KeV. An Si substrate is prepared as a support substrate, and the thermal oxidation film in a thickness of 500 nm was grown. A plasma activation process was applied to the LT substrate and the Si substrate, and surface activation was performed. The two substrates were bonded to each other, and subjected to heat treatment at a temperature of 100° C. for 24 hours. Subsequently, peeling was performed at the ion implantation interface in which flash light was irradiated to the bonded substrates from the LT side using a flash lamp annealing (FLA) device. Thus, a composite substrate having a stack of the LT thin film in a thickness of about 600 nm on the Si substrate through the SiO$_2$ layer can be obtained. After polishing to provide a mirror surface, evaluation was performed. However, in a thermal endurance test, peeling was not observed.

Note that in Example 18, the implantation of hydrogen ions to the LT substrate can also be performed before the SiO$_2$ film is deposited. Also with this configuration, the effect similar to the case can be obtained in which the SiO$_2$ film was deposited and then hydrogen ions were implanted. When the dose amount of hydrogen ions ranges from $6.0 \times 10^{16}$ atoms/cm$^2$ to $2.75 \times 10^{17}$ atoms/cm$^2$, the similar effect can be obtained. Instead of hydrogen ions, the similar effect can be obtained by implanting hydrogen molecule ions (H$_2^+$) in the range of $3.0 \times 10^{16}$ atoms/cm$^2$ to $1.37 \times 10^{17}$ atoms/cm$^2$.

Modifications of Examples

In all the examples and comparative examples, the LT substrate is used as a piezoelectric single crystal substrate. However, instead of the LT substrate, results in exactly the same tendency were obtained even using an LN substrate. Even though the material of the second intermediate layer was changed from SiO$_2$ to SiOx, Al$_2$O$_3$, AlN, SiN, SiON, and Ta$_2$O$_5$, for example, other than SiO$_2$, the similar results were obtained. For the film material of the intermediate layer, SiO$_2$ was used for all the investigation. However, the effect was exactly the same even on materials that are not strictly stoichiometric like SiO$_{2\pm0.5}$. It is considered that the effect is exerted by the intermediate layer mainly burying the irregularities. Even in the case in which the material of the support substrate was changed to silicon, silicon carbide, silicon nitride, or aluminum nitride, a synthetic silica film was formed on the surface by CVD, PVD, or by applying organic silicon, the substrate was heated and sintered at a temperature of 800° C. or more, and then thermally synthesized silica was formed, the substrates were able to be excellently joined to each other. The substrates were diced in two-millimeter squares for a temperature cycle test. However, no peeling was observed.

REFERENCE SIGNS LIST

100 support substrate
200 piezoelectric single crystal substrate
300 intermediate layer
310 first intermediate layer
320 second intermediate layer
330 third intermediate layer

The invention claimed is:

1. A composite substrate comprising:
a piezoelectric single crystal substrate;
a support substrate; and
an intermediate layer provided between the piezoelectric single crystal substrate and the support substrate, wherein
the intermediate layer is a film formed of an inorganic material, and the intermediate layer is separated into at least three layers along a bonding surface of the composite substrate, and the intermediate layer includes:
a first intermediate layer containing a thermally synthesized silica, the first intermediate layer being in contact with the support substrate;
a second intermediate layer provided on the piezoelectric single crystal substrate side of the piezoelectric single crystal substrate; and
a third intermediate layer formed of amorphous silicon,
wherein the first intermediate layer is joined to the second intermediate layer as the third intermediate layer is sandwiched between the first intermediate layer and the second intermediate layer.

2. The composite substrate according to claim 1, wherein a material of the support substrate is a silicon substrate, and the thermally synthesized silica is synthesized by thermal oxidation of the silicon substrate.

3. The composite substrate according to claim 1, wherein the thermally synthesized silica is a sintered body of synthetic silica.

4. The composite substrate according to claim 1, wherein the intermediate layer is separated into at least two layers along a bonding surface of the composite substrate, and a material of a second intermediate layer provided on the piezoelectric single crystal substrate side of a first intermediate layer in contact with the support substrate includes at least one of SiOx, Al$_2$O$_3$, AlN, SiN, SiON, and Ta$_2$O$_5$.

5. The composite substrate according to claim 4, wherein the second intermediate layer has at least two layers having different materials.

6. The composite substrate according to claim 1, wherein a thickness of the first intermediate layer is 20 nm or more.

7. The composite substrate according to claim 1, wherein a thickness of the second intermediate layer is 25 μm or less.

8. The composite substrate according to claim 1, further comprising a thermally synthesized silica layer on a back surface of the support substrate.

9. The composite substrate according to claim 1, wherein the third intermediate layer is formed of amorphous silicon in a thickness of 50 nm or less.

10. The composite substrate according to claim 1, wherein a thickness of the intermediate layer is 8 μm or less.

11. The composite substrate according to claim 10, wherein a thickness of the intermediate layer is 7 μm or less.

12. The composite substrate according to claim 1, wherein a thickness of the piezoelectric single crystal is 20 μm or less.

13. The composite substrate according to claim 1, wherein an interface between the piezoelectric single crystal and the intermediate layer has an irregular structure.

14. A surface acoustic wave device comprising the composite substrate according to claim 1.

15. The surface acoustic wave device according to claim 14, wherein a thickness of the piezoelectric single crystal is 1.0 times or more and 3.5 times or less of a wavelength a surface acoustic wave.

* * * * *